United States Patent [19]
Jordan et al.

[11] Patent Number: 5,386,338
[45] Date of Patent: Jan. 31, 1995

[54] HEAT SINK ATTACHMENT ASSEMBLY

[75] Inventors: William D. Jordan, Dallas; Matthew C. Smithers, Lewisville, both of Tex.

[73] Assignee: Thermalloy, Inc., Dallas, Tex.

[21] Appl. No.: 169,354

[22] Filed: Dec. 20, 1993

[51] Int. Cl.$^6$ .............................................. H05K 7/20
[52] U.S. Cl. ..................................... 361/704; 24/458; 165/80.3; 174/16.3; 248/510
[58] Field of Search ........................ 257/718, 719, 727; 411/352, 511, 516, 530; 24/295, 457, 458, 625; 248/316.7, 505, 510; 165/80.3, 185; 439/485; 174/16.3; 167/150, 160; 361/704, 707, 709, 717, 718, 722

[56] References Cited

U.S. PATENT DOCUMENTS

| | | | |
|---|---|---|---|
| 5,241,453 | 8/1993 | Bright | 361/704 |
| 5,251,101 | 10/1993 | Liu | 361/717 |
| 5,307,239 | 4/1994 | McCarty | 361/704 |
| 5,323,845 | 6/1994 | Kin-Shon | 165/80.3 |

OTHER PUBLICATIONS

Spring-Clip—Heat Sink, Almquist, IBM Tech Discl Bull vol. 23 No. 12 May 1981, pp. 5303.

*Primary Examiner*—Gerald P. Tolin
*Attorney, Agent, or Firm*—Jack A. Kanz

[57] ABSTRACT

A mounting spring clamp for securing a heat sink to a device package is secured to the heat sink by positioning the central body portion of the spring clamp in an attachment clip. The clip is compressed and positioned in a groove of the heat sink. The clip comprises a semi-circular shaped seat with ears extending from both sides of the seat and is made from a flexible material. Compression of the ears reduces the seat diameter, thereby trapping the spring's central body, and also creates spring force in the ears, thereby trapping the clip between the fins of the heat sink. The mounting spring has an elongated body with ends extending from the axis of its central body. The ends may be trapped or hooked in appropriate receivers on a frame or socket holding an electronic device package to secure the heat sink adjacent the device package.

13 Claims, 1 Drawing Sheet

HEAT SINK ATTACHMENT ASSEMBLY

This invention relates generally to apparatus for securing electronic components to heat sinks for dissipation of thermal energy. More particularly, it relates to an assembly of a spring and spring clip securing a heat sink to and in thermal communication with an electronic device package.

BACKGROUND OF THE INVENTION

Advances in microelectronics technology tend to develop device chips which occupy less physical space while performing more electronic functions. Conventionally, the chips are packaged for use in housings which protect the chip from its environment and provide means for input/output communication between the chip and external circuitry. The continuing drive toward miniaturization thus results in generation of more heat in less physical space with less structure for removing the heat from the package. Similarly, the development of electronic circuit device chips using compound semiconductors further expands the requirements for packaging which can contain devices operating at higher temperatures and control device temperatures by heat dissipation.

In many device packages heat conduction from the chip to the exterior of the package is accomplished by a high thermal conductivity transfer medium which is in thermal communication with the chip and has a dissipation surface adjacent the surface of the package. Other packages merely conduct the heat through the package itself. However, in order to dissipate heat from the package, an external heat sink must be attached to the device package. Typically, the heat sink is a body of material such as metal which has a high thermal conductivity. The heat sink ordinarily has at least one flat face for positioning adjacent a face of the device package and may include fins, pins or other structures for dissipating thermal energy into the surrounding atmosphere.

To be effective, the heat sink must occupy as little space as possible while dissipating maximum amounts of thermal energy. It is also desirable that the heat sink be readily attachable to and removeable from the device package and adaptable for connection to a wide variety of different device packages. Where large numbers of the devices are used in an assembly process, economics demand that the assembly process, including assembly of heat sinks, etc., be simple, automatable, versatile and reliable. Accordingly, attaching heat sinks by adhesives, screws, bolts and the like is highly undesirable. Attachment by simple clips and the like is much preferred because it is fast and usually very easy.

Previous attempts to secure a heat sink to a chip or chip housing tend to reduce the amount of potential heat dissipation surface area and do not fixedly secure the heat sink. Typical examples are disclosed in U.S. Pat. No. 5,208,731 to Blomquist entitled Heat Dissipating Assembly and Japan Patent No. 71154 to Koga entitled Method of Mounting Heat Sink. In Koga and Blomquist the attachment consists of a snap-on clip and the force needed to install the clips must be applied in the plane of the heat sink between the pins or fins of the heat sink, thereby risking damage to the heat sink pins or fins. Furthermore, the attachment assembly is not secured to the heat sink. Accordingly, when the heat sink is removed from the chip housing, the clip is a loose part and a potential hazard if dropped. In addition, the arrangements disclosed in the aforementioned patents preclude preassembly of the heat sink and attachment. Instead, assembly of the attachment to the heat sink must be performed simultaneously with the installation of the circuit device. Accordingly, there is a need for an improved heat sink attachment assembly which can be fixed to the heat sink before installation on the device package and one which reduces the risk of damage to the heat sink and device package during the installation procedure. Furthermore, an attachment assembly is needed which occupies minimal space so that the heat dissipation properties of the heat sink configuration are not adversely affected.

SUMMARY OF THE INVENTION

In accordance with the present invention, a heat sink attachment assembly is provided in which a simple spring clamp is used to attach the heat sink to a socket, frame or other attachment support to secure the heat sink to a device package. The spring clamp mounting device is secured to the heat sink with a clip formed from a thin rectangular sheet of metal stamped into an shape. The semi-circular portion of the defines a seat and the ears extending from each side of the seat are rotated slightly upwardly to define a gap for receiving the spring clamp. The spring clamp comprises an elongated base portion which is positioned in the semi-circular shaped seat of the clip and traverses one surface of the heat sink. Once the assembly is positioned between the fins of the heat sink, the ears are pushed together by the fins, causing the gap between the ears and the seat diameter to reduce. By reducing the seat diameter and the gap, the spring base is pinched and held firmly in place by the clip. Since no modifications to the heat sink are required, the cost of implementing the present heat sink attachment assembly is minimized.

DESCRIPTION OF THE DRAWING

The invention may take various forms and is suitable for use in a wide variety of assembly operations. By securing the attachment assembly to the heat sink, the assembly operation of the heat sink is simplified and thus less expensive and more reliable. In addition, this allows the attachment assembly to be pre-installed. Other features and advantages of the invention will become more apparent from the following description taken in connection with the appended claims and attached drawing in which:

DESCRIPTION OF PREFERRED EMBODIMENTS

Figure 1:
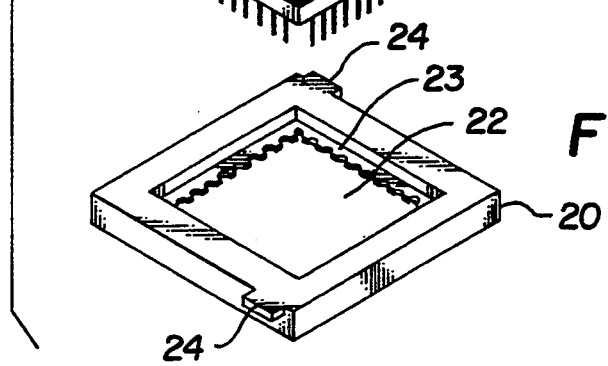
FIG. 1 is an exploded view of an assembly comprising a device package, an attachment frame and a heat sink employing heat sink attachment assembly of the invention.
Figure 2:
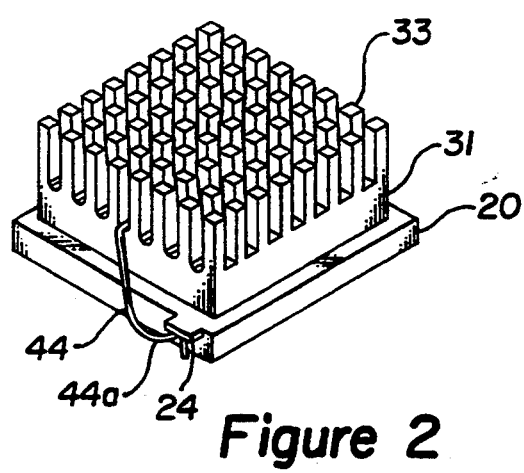
FIG. 2 is a perspective view of the assembly of FIG. 1.
Figure 4:
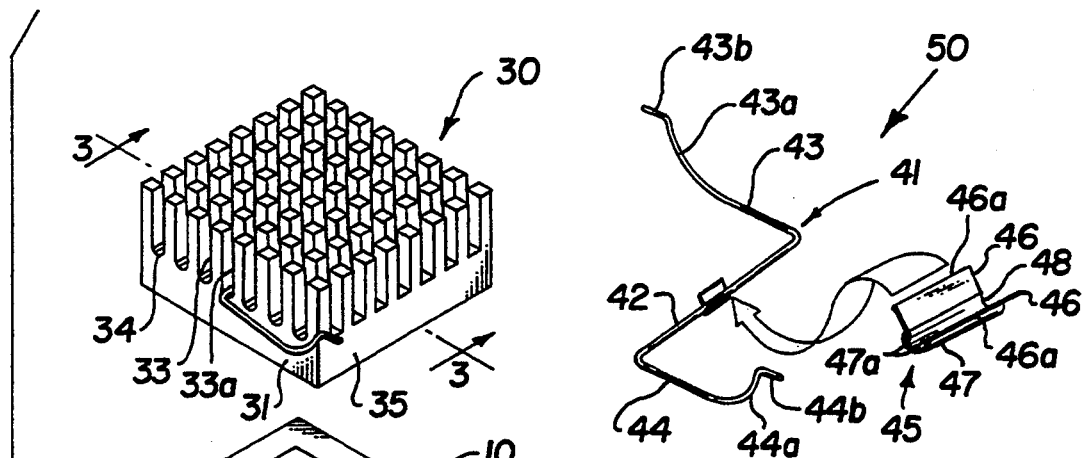
FIG. 4 is a perspective view of the heat sink attachment assembly of FIG. 1.

A preferred embodiment of the invention is shown in combination with a heat sink 30, an electronic device package 10 and a mounting frame 20 in FIGS. 1 and 2. As illustrated, the heat sink attachment assembly 50 comprises a spring clamp 41 and a clip 45. The heat sink 30 illustrated comprises a body 31 of thermally conductive material such as aluminum, aluminum alloy, copper or the like having a substantially flat first major face 35 and elongated pins 33 extending from the opposite face. In the preferred embodiment, pins 33 are formed by cutting across parallel fins which were previously formed by extruding or by sawing parallel grooves in the body 31. Regardless of the method of manufacture, the body 31 has at least a plurality of parallel grooves or channels 34 extending in a first direction to form fins 33 for conducting heat from the body 31 into the surrounding atmosphere.

A preferred embodiment of the heat sink attachment assembly 50 comprises a spring clamp assembly 50 having a spring clamp 41 with an elongated central body portion 42 defining a major axis with arms 43 and 44 extending in substantially opposite directions normal to the axis of the central body portion 42 to define a substantially Z-shaped device, each arm having end portions 43a and 44a curving upwardly with a flat handle 43b and 44b for engaging a positioning means. The spring 41 can be formed of any suitable material which is flexible but resilient such as a rod or heavy wire of steel, aluminum or the like. Clip 45 is formed from a thin rectangular sheet of metal stamped into an shape. It should be noted that the clip 45 can be formed from any suitable material which is flexible but resilient such as a steel, aluminum, plastic or the like. The semi-circular portion of the defines a seat 47 and the ears 46 extending from each side of the seat 47 are rotated slightly upwardly. The distal edges of the ears 46 define bearing surfaces 46a for bearing against fins 33 of heat sink 30. The junctures of ears 46 and seat 47 define two edges 47a. The separation between edges 47a in turn defines a gap 48.

Figure 3:
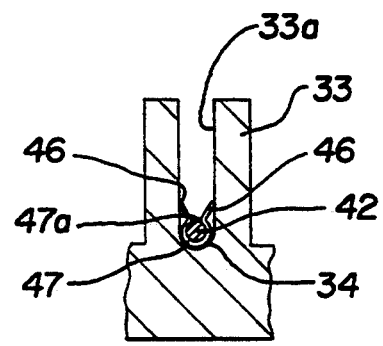
FIG. 3 is a fragmentary sectional view of the heat sink and heat sink attachment assembly of FIG. 1 taken through lines 3—3.

In the uninstalled condition, gap 48 is larger than the diameter of the central body portion 42 of the spring clamp 41 and allows the central body portion 42 to be positioned in the seat 47. Once the spring 41 is positioned in the seat 47, the heat sink attachment assembly 50 can be installed in the heat sink 30 as illustrated in FIG. 3. To install the assembly 50, however, the two ears 46 must be compressed to clear fins 33 of heat sink 30 since the distance between the two bearing surfaces 46a of the ears 46 in the uninstalled condition is greater than the distance between adjacent fins 33 of the heat sink 30. Once ears 46 are compressed, the assembly 50 can be positioned in the grooves 34 of the heat sink 30. In the installed condition, bearing edges 46a of the ears 46 bear against the surfaces 33a of adjacent fins 33 causing the gap 48 and the diameter of the seat 47 to decrease and trapping the elongated central body 42 of the spring 41 in the seat 47 of the clip 45. By trapping the central body portion 42 as described, the spring 41 is journaled in the seat 47 and secured therein. The end portions 43, 44 are positioned on opposite sides of the body 31 while the central portion 42 is trapped between the fins 33 by clip 45.

Attachment of the heat sink to an electronic device package using the subassembly 30 is illustrated in FIGS. 1 and 2. In the embodiment illustrated, a frame 20 having an open center 22 and a recessed ledge 23 is used to support the device package 10 about its periphery. It will be recognized that frame 20 is used only to provide means for securing the heat sink 30 to the device package 10 and thus may take many forms, depending on the configuration of the package 10. For example, frame 20 may only receive the corners of the package 10 or may take the form of a shoe or clip which attaches to a portion of the periphery of the device package 10. The frame 20, regardless of its physical arrangement, provides means for receiving the handles 43b, 44b of the clamp 41. In the embodiment illustrated, the frame 20 has tabs 24 extending laterally outwardly from opposite sides thereof near diagonally disposed corners. As illustrated in FIGS. 1 and 2, the device package 10 is positioned within the frame 20 and flat face 35 of the heat sink 30 positioned adjacent the top face of the device package 10. The heat sink assembly is secured together by forcing handles 43b, 44b under tabs 24 on the frame 20.

It will be realized that by securing the spring clamp 41 in the heat sink body 31 the subassembly 30 may be shipped, handled and assembled as a unit. By securing the parts together, many problems associated with loose parts are eliminated and attachment of the subassembly 30 to a device package 10 is much easier and may even be automated. It will also be recognized that the frame 20 may be totally eliminated where the electronic device is positioned in mounting apparatus such as a socket or the like. The socket may have tabs such as tabs 24 for receiving the handles 43b, 44b of the spring or the handles 43b, 44b of the spring may be formed to fit into recesses in the mounting apparatus or under the mounting apparatus. Various other arrangements for securing the ends of the spring to the mounting apparatus may be devised to utilize the subassembly of the invention.

Although the invention has been described with particular reference to a spring which is Z-shaped and attaches to a frame, the form of the invention illustrated is to be taken as illustrative of the principles thereof. The spring clamp 41 may take various other shapes and yet be capable of being secured to a heat sink as described herein. Accordingly, it is to be understood that the forms of the invention shown and described in detail are to be considered examples only and that various changes, modifications and rearrangements may be resorted to without departing from the spirit and scope of the invention as defined by the appended claims.

What is claimed:

1. The combination comprising:
   (a) a heat sink comprising a body of thermally conductive material having at least one substantially flat first major face and a second major face disposed substantially parallel with said first major face with at least two fins extending from said second major face and extending substantially perpendicular to said first major face; and
   (b) a mounting device having an elongated central portion; and
   (c) a clip positioned and secured between said fins receiving and trapping said central portion of said mounting device within said heat sink.

2. The combination defined in claim 1 wherein said clip includes a generally semi-circular shaped seat receiving said central portion of said mounting device and ears extending from both sides of said seat defining a mouth therebetween which decreases in size as said ears are pinched together.

3. The combination defined in claim 1 wherein said heat sink includes a plurality of fins projecting from said second major face defining a plurality of grooves parallel with and lying between said fins.

4. The combination defined in claim 3 wherein said fins are defined by rows of pins.

5. The combination defined in claim 1 wherein said mounting device comprises an elongated central portion defining a first axis and end portions extending from said central portion in a direction substantially normal to the axis of said central portion.

6. The combination defined in claim 1 wherein said mounting device is an elongated body of spring material with a central body portion and ends extending in substantially opposite directions from said central body portion.

7. The combination defined in claim 1 including an electronic device package having a substantially flat major face positioned adjacent and in thermal communication with said first major face of said heat sink.

8. The combination defined in claim 7 including mounting apparatus cooperating with said mounting device to secure said heat sink to said electronic device package.

9. The combination defined in claim 8 wherein said mounting apparatus comprises a socket for receiving input/output leads extending from said electronic device package.

10. The combination defined in claim 8 wherein said mounting apparatus comprises an open frame which receives and supports the electronic device package about its periphery.

11. The combination comprising:
(a) a heat sink comprising a body of thermally conductive material having at least one substantially flat first major face and a second major face disposed substantially parallel with said first major face with at least two fins extending from said second major face and extending substantially perpendicular to said first major face;
(b) a mounting device comprising an elongated body of spring material with a central body portion and ends extending in substantially opposite directions from said central body portion; and
(c) an attachment clip having a generally semi-circular shaped seat receiving the central portion of the elongated body of said mounting device and ears extending from both sides of said seat defining a mouth therebetween which decreases in size as said ears are pinched together to trap said central portion of said mounting device, with said clip positioned and secured between said fins.

12. The combination defined in claim 11 wherein said heat sink includes a plurality of fins projecting from said second major face defining a plurality of grooves parallel with and lying between said fins.

13. The combination defined in claim 11 including:
(a) an electronic device package having a substantially flat major face positioned adjacent and in thermal communication with said first major face of said heat sink; and
(b) an apparatus cooperating with said mounting device to secure said heat sink to said electronic device package.

* * * * *

UNITED STATES PATENT AND TRADEMARK OFFICE
CERTIFICATE OF CORRECTION

PATENT NO. : 5,386,338
DATED : January 31, 1995
INVENTOR(S) : William D. Jordan, et al.

It is certified that error appears in the above-identified patent and that said Letters Patent is hereby corrected as shown below:

Col. 2, line 24, before "shape" insert ---℧--- (inverted omega)

Col. 2, line 24, between "the" (second occurrence) and "defines" insert ---℧--- (inverted omega)

Col. 3, line 25, between "an" and "shape" insert ---℧--- (inverted omega)

Col. 3, line 29, between "the" (first occurrence) and "defines" insert ---℧--- (inverted omega)

Signed and Sealed this

Sixteenth Day of May, 1995

BRUCE LEHMAN

*Attest:*

*Attesting Officer*     *Commissioner of Patents and Trademarks*